(12) United States Patent
Offenberg et al.

(10) Patent No.: US 7,259,436 B2
(45) Date of Patent: Aug. 21, 2007

(54) MICROMECHANICAL COMPONENT AND CORRESPONDING PRODUCTION METHOD

(75) Inventors: Michael Offenberg, Kirchentellinsfurt (DE); Markus Lutz, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 262 days.

(21) Appl. No.: 10/018,180

(22) PCT Filed: Mar. 22, 2001

(86) PCT No.: PCT/DE01/01116

§ 371 (c)(1),
(2), (4) Date: Sep. 9, 2002

(87) PCT Pub. No.: WO01/77008

PCT Pub. Date: Oct. 18, 2001

(65) Prior Publication Data

US 2003/0049878 A1    Mar. 13, 2003

(30) Foreign Application Priority Data

Apr. 11, 2000  (DE)  ................ 100 17 976

(51) Int. Cl.
*H01L 29/76* (2006.01)
*H01L 29/94* (2006.01)
*C30B 23/00* (2006.01)
*C30B 25/00* (2006.01)

(52) U.S. Cl. .............. 257/412; 257/413; 257/414; 257/415; 117/84; 117/88

(58) Field of Classification Search ........ 257/412–415; 117/84, 88
See application file for complete search history.

(56) References Cited

U.S. PATENT DOCUMENTS

| | | | | |
|---|---|---|---|---|
| 5,075,253 A | * | 12/1991 | Sliwa, Jr. ................. | 438/109 |
| 5,929,497 A | * | 7/1999 | Chavan et al. ............ | 257/417 |
| 6,067,858 A | * | 5/2000 | Clark et al. .............. | 73/504.16 |
| 6,150,275 A | * | 11/2000 | Cho et al. ................. | 438/696 |
| 6,187,607 B1 | * | 2/2001 | Offenberg et al. ......... | 438/48 |
| 6,328,794 B1 | * | 12/2001 | Brouillette et al. ......... | 117/4 |
| 6,689,694 B1 | * | 2/2004 | Cho et al. ................. | 438/696 |
| 6,936,491 B2 | * | 8/2005 | Partridge et al. ........... | 438/48 |

(Continued)

FOREIGN PATENT DOCUMENTS

DE    43 18 466    12/1994

(Continued)

OTHER PUBLICATIONS

Wolf et al., Silicon Processing for the VLSI Era vol. 1: Processing Technology, Lattice Press, sunset Beach, CA, USA, pp. 1151-1156, 1986.*

(Continued)

*Primary Examiner*—Robert Kunemund
*Assistant Examiner*—G. Nagesh Rao
(74) *Attorney, Agent, or Firm*—Kenyon & Kenyon LLP

(57) ABSTRACT

A micromechanical component includes: a substrate; a micromechanical functional plane provided on the substrate; a covering plane provided on the micromechanical functional plane; and a printed circuit trace plane provided on the covering plane. The covering plane includes a monocrystalline region which is epitaxially grown on an underlying monocrystalline region, and the covering plane includes a polycrystalline region which is epitaxially grown on an underlying polycrystalline starting layer at the same time.

10 Claims, 4 Drawing Sheets

U.S. PATENT DOCUMENTS

| | | | |
|---|---|---|---|
| 6,952,041 B2 * | 10/2005 | Lutz et al. | 257/415 |
| 7,056,757 B2 * | 6/2006 | Ayazi et al. | 438/48 |
| 7,068,125 B2 * | 6/2006 | Lutz et al. | 333/186 |
| 7,075,160 B2 * | 7/2006 | Partridge et al. | 257/414 |
| 7,102,467 B2 * | 9/2006 | Lutz et al. | 333/186 |
| 7,153,716 B2 * | 12/2006 | Ikegami | 438/51 |

FOREIGN PATENT DOCUMENTS

| | | |
|---|---|---|
| DE | 43 41 271 | 6/1995 |
| DE | 195 37 814 | 4/1997 |
| DE | 197 00 290 | 7/1998 |
| EP | 0 890 998 | 1/1999 |
| EP | 0 895 090 | 2/1999 |
| WO | WO97/04319 | 2/1997 |
| WO | WO98/23934 | 6/1998 |

OTHER PUBLICATIONS

Gennissen PTJ et al. "Bipolar-compatible expitaxial poly for smart sensors: Stress minimization and applications." Sensors and Actuators, Jul. 1, 1997, pp. 636 to 645.

* cited by examiner

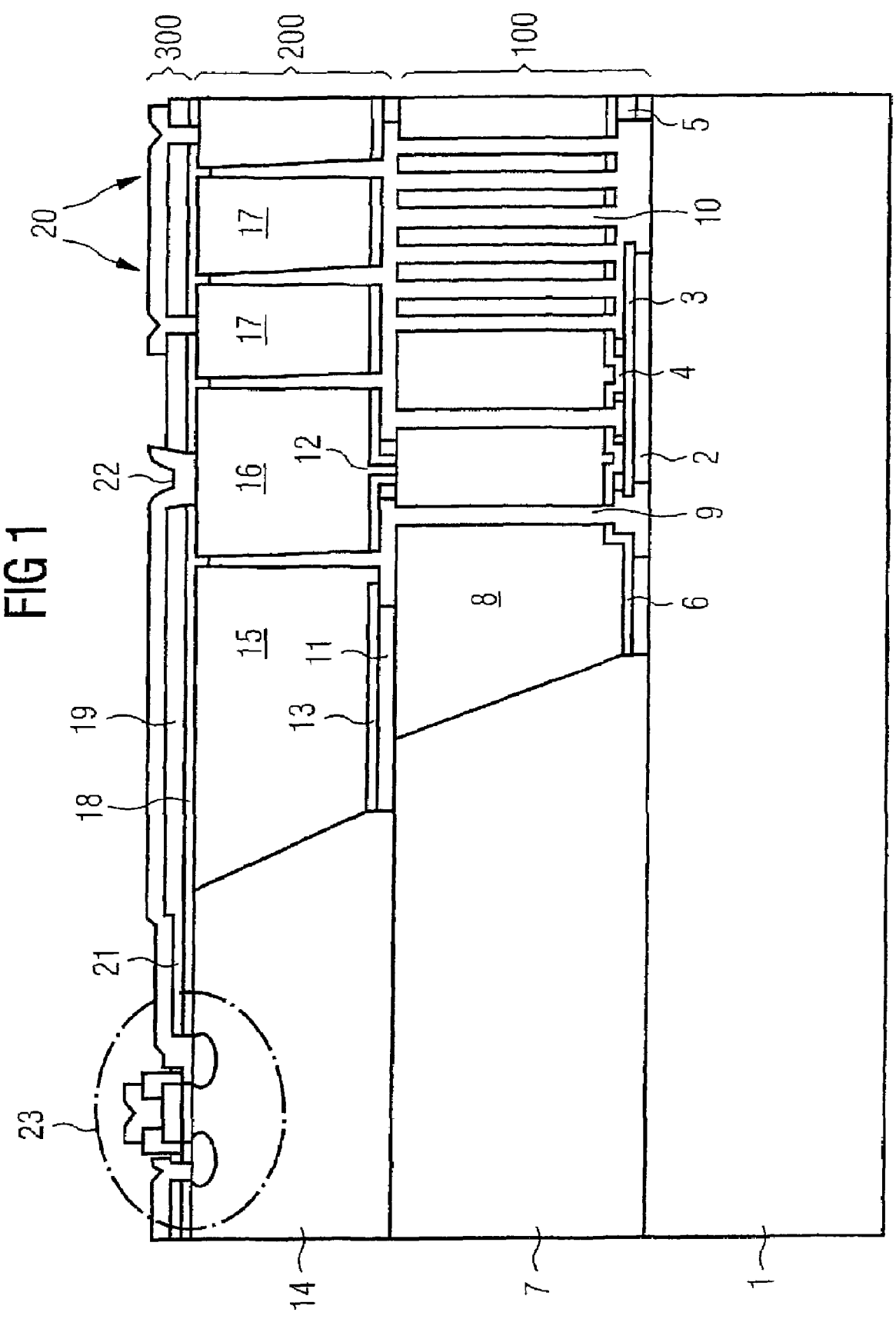

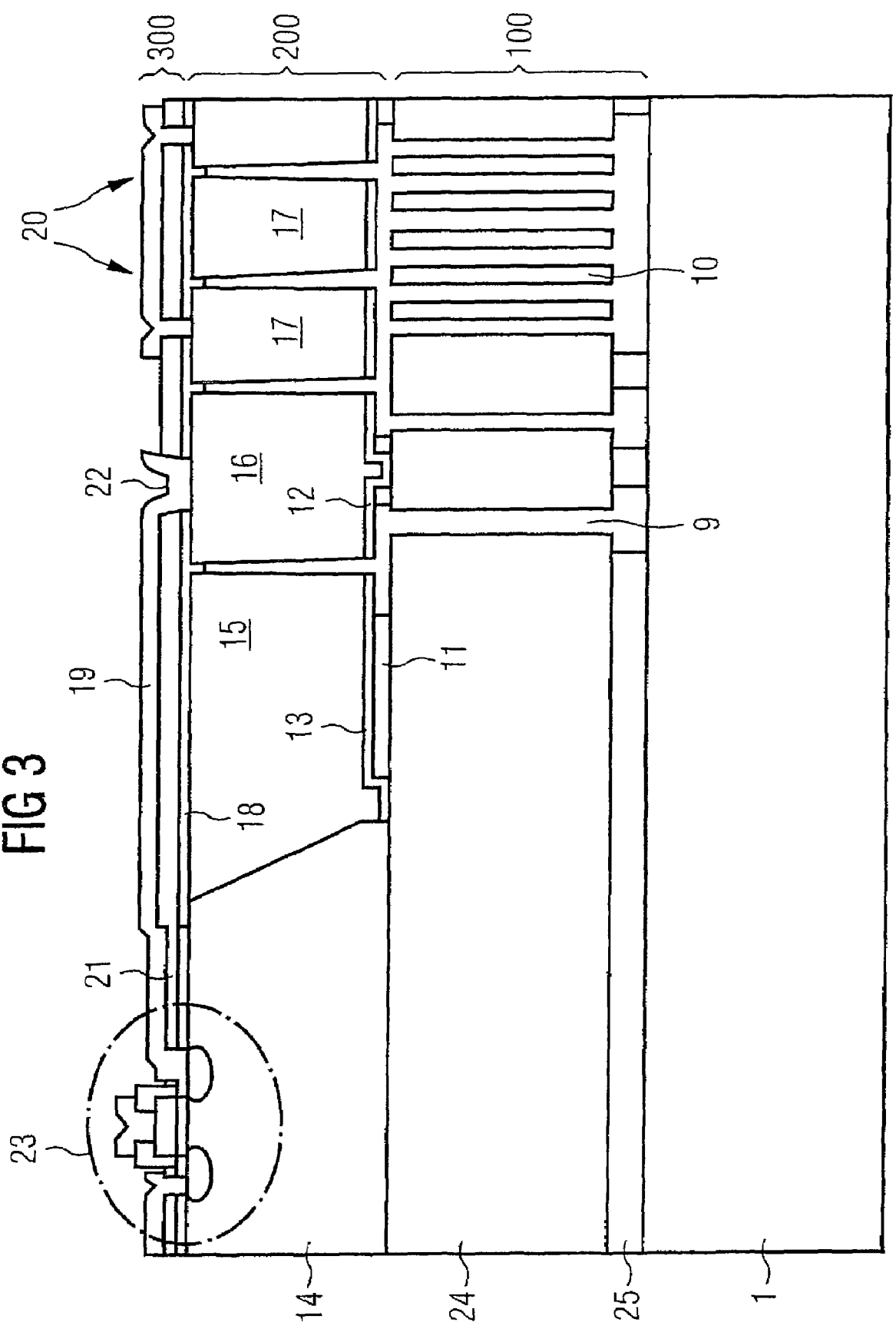

MICROMECHANICAL COMPONENT AND CORRESPONDING PRODUCTION METHOD

This application is a 371 of PCT/DE01/01116 filed on Mar. 22, 2001.

FIELD OF THE INVENTION

The present invention relates to a micromechanical component including a substrate, a micromechanical functional plane provided on the substrate, a covering plane provided on the micromechanical functional plane, and a printed circuit trace plane provided on the covering plane. The present invention also relates to a corresponding manufacturing method.

BACKGROUND INFORMATION

Micromechanical function will be understood as an arbitrary active function, for example a sensor function, or passive function, for example a printed circuit trace function.

Although applicable to arbitrary micromechanical components and structure, in particular to sensors and actuators, the present invention and its underlying problem will be explained with reference to a micromechanical component, for example an acceleration sensor, which is manufacturable in the technology of silicon surface micromachining.

Monolithically integrated, surface-micromachined inertial sensors with movable structures affixed to a chip in an unprotected manner (analog devices) are generally known. These designs cause an increased expenditure of time and energy during handling and packaging.

These problems can be avoided using a sensor having an evaluation circuit on a separate chip; in this context, for example, the surface-micromachined structures are covered by a second cap wafer. This type of packaging composes a high portion of the cost of a surface-micromachined acceleration sensor. This cost results from the large surface required for the sealing surface between the cap wafer and the sensor wafer and because of the complex patterning (2-3 masks, bulk micromachining) of the cap wafer.

The evaluation circuit is implemented on a second chip and connected to the sensor element via wire bonding. This, in turn, creates the necessity for the sensor elements to be sized such that the parasitic effects developing due to the parasites in the lead wires and bonding wires are negligible and that they no longer have any dominant influence on the sensor function. In addition, flip-chip techniques are ruled out because of parasitic effects.

Such sensors could use considerably less surface for the micromechanics if the evaluation circuit were situated on the same Si chip and the sensitive electrodes could be connected with only low parasities.

German Published Patent Application No. 195 37 814 describes the structure of a functional layer system and a method for the hermetically packaging of surface-micromachined sensors. Explained in this context is the manufacture of the sensor structure using known technological methods. The mentioned hermetical packaging is effected using a separate cap wafer which is made of silicon and patterned using complex patterning processes such as KHO etching. The cap wafer is affixed to the substrate featuring the sensor (sensor wafer) using a glass solder (seal glass). For this purpose, a broad bonding frame is required around each sensor chip to ensure sufficient adhesion and tightness of the cap. This considerably reduces the number of sensor chips per sensor wafer. Due to the large space required and the complex manufacture of the cap wafer, considerable costs are attributable to the sensor packaging.

German Published Patent Application No. 43 41 271 describes a micromechanical acceleration sensor whose components are composed partly of monocrystalline material and partly of polycrystalline material. For manufacturing this micromechanical acceleration sensor, an epitaxial reactor is used. A starting layer made of LPCVD polysilicon is used for determining the regions where polycrystalline silicon is intended to grow during the epitaxial process.

SUMMARY

The micromechanical component and the manufacturing method according to the present invention have several advantages. It is possible for the evaluation circuit and the sensor element to be monolithically integrated on one chip. Error-prone complex bonding wires between the sensor element and the evaluation circuit may be omitted. The size of the sensing elements may be reduced since less parasitic effects occur in the bonding. Only one chip has to be mounted. The process is based on the surface-micromachining process described in German Published Patent Application No. 43 18 466, which yields epitaxial polysilicon having a thickness of at least 10 µm. A simplification of the surface-micromachining process is provided because the structures may be bonded from above. The buried polysilicon may be omitted.

The integration of the component is independent of the process of the evaluation circuit to the greatest possible extent. As a result, the adaptation to new IC processes is simplified. Depending on the sensor principle, the component may be reduced to the size of the bonding pads heretofore required on the IC for bonding, which results in the cost not increasing due to additional surface.

According to the present invention, the sensor chip may be connected using the so-called "flip-chip method", that is upside down with eutectic or gold bumps instead of using bonding wires, since the parasitic influences are strongly reduced in comparison with the two-chip solution. Using this technique, it is also possible to produce sensors with CSP (chip scale package), package of which is no more than 20% larger than the chip. A CSP-packaged chip may be premeasured and trimmed prior to assembly.

The core of the present invention is the combination of the single-crystalline and polycrystalline growth during the deposition of the covering layer in the epitaxial reactor. In the process, single-crystalline silicon requires a single-crystalline surface as a starting layer, polycrystalline silicon requires a polycrystalline starting layer which may be deposited using LPCVD.

According to one example embodiment, a first layer featuring the micromechanical functional plane has a monocrystalline region which is epitaxially grown on the underlying monocrystalline region as well as a polycrystalline region which is epitaxially grown on the underlying polycrystalline starting layer at the same time. Thus, the same epitaxial step is used twice in two different planes.

According to another example embodiment, a first layer featuring the micromechanical functional plane has an SOI-type monocrystalline region formed above an insulator layer with the substrate. This has the advantage that the buried polysilicon layer may be omitted and that one epitaxial step is dropped. A single-crystalline, high-doped base silicon material may be used which is free of mechanical stress.

According to another example embodiment, the monocrystalline region includes a second layer which is deposited on the first layer and which features one or a plurality of integrated circuit elements of an evaluation circuit or wiring elements. In this manner, a so-called "monolithically integrated one-chip solution" may be attained.

According to another example embodiment, the polycrystalline region of the micromechanical functional plane features a movable sensor structure.

According to another example embodiment, the micromechanical functional plane features a buried polysilicon layer underneath the movable sensor structure.

According to another example embodiment, one or a plurality of flip-chip connection elements, e.g., gold bumps, are provided in the printed circuit trace plane. This is a rugged bonding type which is made possible by the substantially planar surface.

According to another example embodiment, the component may be manufactured by silicon surface micromachining.

BRIEF DESCRIPTION OF THE DRAWINGS

FIG. 1 is a schematic cross-sectional view of a micromechanical component according to a first example embodiment of the present invention.

FIG. 3 is a schematic cross-sectional view of a micromechanical component according to a second example embodiment of the present invention.

DETAILED DESCRIPTION

Figure 2A:
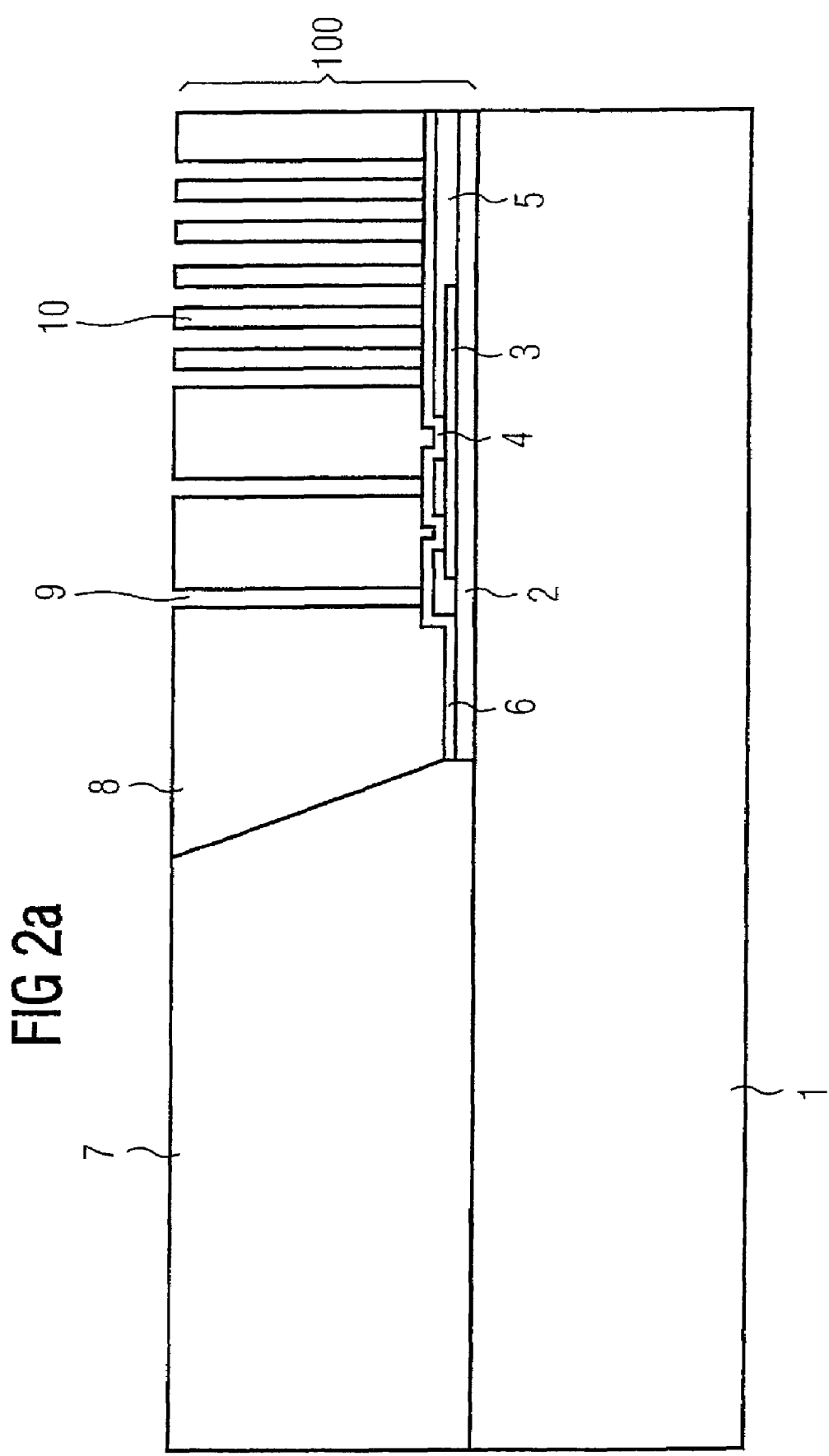
FIGS. 2a and b are schematic cross-sectional views of the manufacturing steps of the micromechanical component illustrated in FIG. 1.

In the Figures, identical or functionally identical components are denoted by the same reference symbols.

FIG. 1 is a schematic cross-sectional view of a micromechanical component according to a first example embodiment of the present invention.

In FIG. 1, 1 denotes a silicon substrate wafer, 2 a lower oxide, 3 buried polysilicon, 4 a contact hole in sacrificial oxide 5, 5 a sacrificial oxide, 6 a first starting polysilicon, 7 a first single-crystalline silicon of epitaxy, 8 a first epitaxial polysilicon, 9 an insulating trench, 10 a movable sensor structure, 11 a first refill oxide, 12 a contact hole in refill oxide 11, 13 a second starting polysilicon, 14 a second single-crystalline silicon of epitaxy, 15 a second epitaxial polysilicon, 16 an electrical and/or mechanical connecting element between the first and the second epitaxial polysilicon, 17 a trench, 18 a second refill oxide, 19 an oxide for insulating the printed circuit traces, 20 a cross connection, 21 a printed circuit trace, 22 a contact hole in printed circuit trace 21 and in refill oxide 18 and 23 an electronic component of the evaluation circuit.

100 denotes a micromechanical functional plane featuring a movable sensor structure 10, here an acceleration sensor, 200 a covering plane for hermetically sealing movable sensor structure 10, and 300 a printed circuit trace plane.

In this first example embodiment, which may be manufactured by silicon surface micromachining which is conventional, covering plane 200, features a monocrystalline region 14, which is epitaxially grown on underlying monocrystalline region 7. Covering plane 200 features polycrystalline region 15 which is epitaxially grown on underlying polycrystalline starting layer 13 at the same time. Monocrystalline and polycrystalline silicon is grown side by side in one process step.

Monocrystalline region 14 of covering plane 200 contains integrated circuit elements of an evaluation circuit. A CMOS transistor 23 is illustrated as an example.

Analogously, micromechanical functional plane 100 features monocrystalline region 7 which is epitaxially grown on underlying monocrystalline substrate region 1 and polycrystalline region 8 which is epitaxially grown on underlying polycrystalline starting layer 6 at the same time. This process step of simultaneously growing Si in single- and polycrystalline form is performed both for sensor structure 10 and for covering plane 200.

Micromechanical functional plane 100 features buried polysilicon layer 3 underneath movable sensor structure 10 as a wiring plane.

FIGS. 2a and b are schematic cross-sectional views of the manufacturing steps of the micromechanical component illustrated in FIG. 1.

In general, IC processes require a single-crystalline Si substrate as a starting material for the process. This applies both to processes with analog components requiring an epitaxially deposited single-crystalline Si layer and pure CMOS processes not requiring epitaxy. In this example, therefore, one starts with a single-crystalline Si wafer as substrate 1.

In a first step, an oxidation of substrate 1 is performed to form lower oxide 2. Subsequently, buried polysilicon 3 is deposited and patterned as a lower printed circuit trace region. In a following step, sacrificial oxide 5 is deposited and patterned. Thereupon, a deposition and patterning of first starting polysilicon 6, in particular a removal of the starting polysilicon and of lower oxide 2 are performed at locations where single-crystalline silicon (region 7 illustrated in FIG. 2a) is intended to grow on substrate 1 during the later epitaxy step.

After that, the epitaxy step is performed in which monocrystalline silicon region 7 is grown together with polycrystalline silicon region 8 of micromechanical functional plane 100. A further step is an optional planarization of the resulting structure to compensate for slight differences in height due to the substructure disposed between substrate 1 and polycrystalline silicon region 8.

Figure 2B:
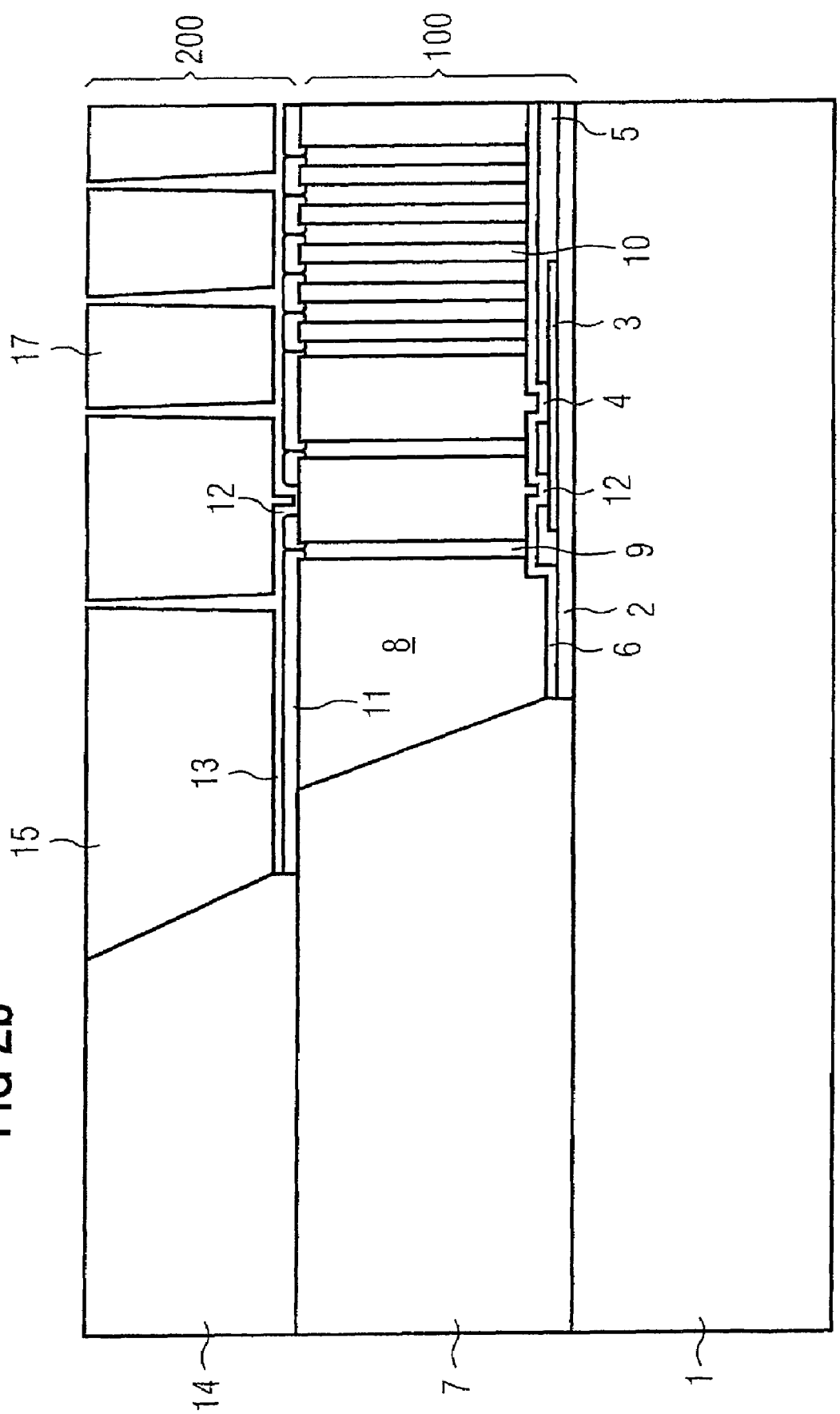

Then, as illustrated in FIG. 2b, a refilling is performed with refill oxide 11 as well as a patterning of refill oxide 11 to form contact holes 12. Subsequently, second starting polysilicon layer 13 is deposited and patterned together with first refill oxide 11, in particular, second starting polysilicon layer 13 and refill oxide 11 are removed at locations where single-crystalline silicon (region 14 illustrated in FIG. 2b) is intended to grow on region 7. In a subsequent process step, the second epitaxial process follows in which monocrystalline silicon is deposited in region 14 and polycrystalline silicon is concurrently deposited in region 15. Again, optionally, a planarization of the resulting covering layer is performed to compensate for the substructure between polysilicon region 8 and polysilicon region 15.

Thereupon, trenches 17 which are used for insulation and as etch holes for removing first refill oxide 11 are formed in second epitaxial polysilicon 15. The etch profile of trenches 17 may be selected so that they widen downward as indicated in FIG. 2b. The upper opening diameter may be selected to be minimal so that the deposition of second refill oxide 18 may be accomplished more quickly and, in fact, without a significant quantity of second refill oxide 18 getting into movable sensor structure 10. Thus, an anisotropic oxide deposition is desired and, to be more precise, only on the surface if possible.

In a subsequent process step, movable sensor structure 10 is etched free by removing lower oxide 2, sacrificial oxide 5 and first refill oxide 11 through etch trenches 17. For better control, it may also be possible to divide the etching free into two steps in that, prior to depositing first refill oxide 11, lower oxides 2 and 5 are removed and first refill oxide 11 is deposited. An important advantage of this process is that, during sacrificial layer etching, which is presently performed with HF vapor, no electronic circuit or aluminum are present yet which, in the case of back-end processes, may be protected only with great difficulty and effort.

In the next step, second refill oxide 18 is deposited and patterned. A predetermined pressure is adjusted, and a predetermined gas atmosphere is adjusted during the final closing of the hollow spaces by second refill oxide 18, which determines the properties of the enclosed gas and consequently, inter alia, the attenuation of mechanical sensor structure 10.

Subsequent to the completion of the micromechanical component, the IC process, for example a CMOS or BiCMOS process, may be performed for manufacturing the evaluation circuit in monocrystalline silicon region 14. Thereupon, a deposition and patterning of printed circuit trace plane 300, in particular of oxide 19 and printed circuit trace aluminum 21 occur. To complete the component, usually, the chips are diced and an assembly is performed as with standard IC components.

FIG. 3 is a schematic cross-sectional view of a micromechanical component according to a second example embodiment of the present invention.

As illustrated in FIG. 3, in addition to the reference symbols already introduced, 24 denotes an SOI (Silicon on Insulator) layer and 25 an insulator layer. In this second example embodiment, substrate 1, insulator layer 25 and monocrystalline silicon layer 24 form an SOI structure which is conventional.

In the component, lower oxide 2, buried polysilicon 3, contact hole 4 in sacrificial oxide 5, sacrificial oxide 5, first starting polysilicon 6, first single-crystalline silicon of epitaxy 7, and first epitaxial polysilicon 8 are omitted. Consequently, if such an SOI wafer is used as the starting material, then numerous process steps are omitted since then, the mechanically active structure is formed from SOI material 24. In this second example embodiment, the entire wiring is transferred into printed circuit trace plane 300.

Although the present invention has been described above in the light of example embodiments, it is not limited thereto but may be modified in many ways.

In particular, it is possible to use arbitrary micromechanical base materials such as germanium and not only the silicon substrate specified by way of example.

Also, it is possible to form arbitrary sensor structures and not only the illustrated acceleration sensor.

Region 15 does not necessarily have to be polycrystalline but may also be recrystallized or the like.

What is claimed is:

1. A micromechanical component, comprising:
    a substrate;
    a micromechanical functional plane provided on the substrate;
    a covering plane provided on the micromechanical functional plane; and
    a printed circuit trace plane provided on the covering plane;
    wherein the covering plane includes a first monocrystalline region epitaxially grown on an underlying second monocrystalline region and a first polycrystalline region epitaxially grown on an underlying first polycrystalline starting layer, wherein the first monocrystalline region and the first polycrystalline region are adjacent to and coplanar with one another in a side by side manner.

2. The micromechanical component according to claim 1, wherein the micromechanical functional plane includes the second monocrystalline epitaxially grown on an underlying third monocrystalline region and a second polycrystalline region epitaxially grown on an underlying second polycrystalline starting layer at the same time.

3. The micromechanical component according to claim 1, wherein the micromechanical functional plane includes the second monocrystalline region, the second monocrystalline region including an SOI-type monocrystalline region formed above an insulator layer with the substrate.

4. The micromechanical component according to claim 1, wherein the first monocrystalline region of the covering plane includes at least one of at least one integrated circuit element of an evaluation circuit and at least one wiring element.

5. The micromechanical component according to claim 1, wherein a second polycrystalline region of the micromechanical functional plane includes a movable sensor structure.

6. The micromechanical component according to claim 5, wherein the micromechanical functional plane includes a buried polysilicon layer underneath the movable sensor structure.

7. The micromechanical component according to claim 1, wherein the printed circuit trace plane includes at least one flip-chip connection element.

8. The micromechanical component according to claim 7, wherein the flip-chip connection element includes a gold bump.

9. The micromechanical component according to claim 1, wherein the micromechanical component is configured to be manufactured by silicon-surface micromachining.

10. A method for manufacturing a micromechanical component, comprising the steps of:
    providing a substrate;
    providing a micromechanical functional plane on the substrate;
    providing a covering plane on the micromechanical functional plane;
    providing a polysilicon starting layer region-wise on the micromechanical functional plane and leaving open region-wise a first monocrystalline region of the micromechanical functional plane;
    epitaxially depositing a second monocrystalline region on the first monocrystalline region left open and epitaxially depositing a polycrystalline region on the polysilicon starting layer at the same time, wherein the second monocrystalline region and the polycrystalline region are adjacent to and coplanar with one another in a side by side manner; and
    providing a printed circuit trace plane on the covering plane.

* * * * *